United States Patent [19]
Kempke et al.

[11] Patent Number: 5,841,874
[45] Date of Patent: Nov. 24, 1998

[54] TERNARY CAM MEMORY ARCHITECTURE AND METHODOLOGY

[75] Inventors: Robert Alan Kempke, Tempe, Ariz.; Anthony J. McAuley, Bloomfield, N.J.

[73] Assignee: Motorola, Inc., Schaumburg, Ill.

[21] Appl. No.: 696,453

[22] Filed: Aug. 13, 1996

[51] Int. Cl.⁶ .................................................... H04L 9/00
[52] U.S. Cl. .................................. 380/50; 380/4; 380/9; 380/23; 380/25; 380/49; 380/59; 326/59; 365/168
[58] Field of Search ............................... 380/4, 9, 23, 25, 380/28, 49, 50, 59; 326/59; 341/57; 365/168; 371/37.04; 395/427, 428, 435

[56] References Cited

U.S. PATENT DOCUMENTS

| | | | |
|---|---|---|---|
| 3,599,205 | 8/1971 | Cornelis et al. | 341/57 |
| 3,671,959 | 6/1972 | Amano | 341/57 |
| 3,706,977 | 12/1972 | Dailey et al. . | |
| 3,760,277 | 9/1973 | Whang | 341/57 X |
| 3,798,544 | 3/1974 | Norman | 380/9 X |
| 4,231,023 | 10/1980 | Warner | 341/57 |
| 4,296,475 | 10/1981 | Nederlof et al. . | |
| 4,809,224 | 2/1989 | Suzuki et al. | 365/168 |
| 4,910,750 | 3/1990 | Fisher | 341/57 X |
| 5,432,735 | 7/1995 | Parks et al. | 365/168 |
| 5,498,980 | 3/1996 | Bowles | 326/59 X |

FOREIGN PATENT DOCUMENTS 650167A 10/1994 European Pat. Off. .

OTHER PUBLICATIONS

An article entitled "Design of a Key Agile Cryptographic System for OC–12c Rate ATM" by Daniel Stevenson, Nathan Hillery, Greg Byrd, Fengmin Gong and Dan Winkelstein, from 1995 IEEE.

An article entitled "A Design Of A High–Density Multi-–Level Matching Array Chip For Associative Processing", IEICE Transactions, vol. E. 74, No. 4 Apr. 1991.

*Primary Examiner*—Bernarr E. Gregory
*Attorney, Agent, or Firm*—James A. Coffing; Bradley J. Botsch; John C. Scott

[57] ABSTRACT

The present invention encompasses a method of storing ternary data that includes the steps of (1) initializing a conversion register by storing binary-to-ternary mask data in a conversion register; (2) storing ternary data in a content addressable memory (CAM) by inputting a single bit binary data to the conversion register, and converting the binary data into two bits of ternary data using the conversion register; and (3) simultaneously storing the two bits of ternary data in first and second memory cells. For subsequent searching, the method further includes the steps of searching for a match of input search binary data to the stored contents of the CAM; providing a match valid output responsive to the input search binary bits matching any of the stored contents; and generating an address corresponding to a location in the CAM where the match is found.

21 Claims, 9 Drawing Sheets

WRITE CYCLE

TERNARY CAM MEMORY ARCHITECTURE AND METHODOLOGY

FIELD OF THE INVENTION

The present invention relates generally to semi-conductor memory, and more particularly, to a cascadable content addressable memory device, and a system using a plurality of such cascaded devices.

BACKGROUND OF THE INVENTION

Content addressable memory devices (CAMs) are extremely valuable in providing associative look-up based on contents of the data. By pre-loading a CAM with a pre-defined data set, including the data to be compared and optionally data to be output when a match is found for a corresponding CAM location, the address where the match is found can be output as an index to the requesting device, or both the address and data can be output for each match. One problem incurred in using CAMs is that the construction of CAM chips requires multiples of the number of transistors needed to implement the CAM memory that a standard read/write random access memory (RAM) would require. Thus, CAM chips are usually much smaller in depth size than RAM chips. Therefore, the capacity of a single CAM chip is frequently inadequate to provide for the necessary associative look-ups. Accordingly, it becomes necessary to use multiple CAM chips in some sort of cascaded or interconnected manner to provide greater depth. Thus, while a single CAM chip, for example, might provide 1k words of 32 bits of CAM capacity, the system's requirements may require 8k or 64k or even 1 megaword of CAM capacity.

Prior system designs have attempted to resolve the depth capacity problem by cascading chips in a seriatim manner where each CAM performed a look up function, and if no match was found, then the next CAM in the cascade chain would attempt its look-up and so forth, looking until a match was found. A major problem with this approach is that there is a variable latency in this architecture, where the time taken to find a match is widely variable from associative look-up to associative look-up, due to the fact that there is uncertainty as to how many CAM chips in the chain will have to be accessed, one at a time in turn, until a match is found. CAM Data Input lines must be run in parallel to all of the chips in the cascade chain, and control logic and intercoupling must be provided between the multiple chips in the cascade chain.

Binary CAM architectures, which store 1 and 0 data, have been the predominant technology used for content addressable memory (CAM) applications because of their speed and density advantages over theoretical ternary CAM architectures, which store 1, 0, and don't care "x" data. This is because each ternary CAM data element contains two memory storage elements, and where static RAM-type memory cells are used, which require data and complement data, two clock cycles are required to write both the data and mask memory elements for each of the ternary CAM cells.

Therefore, a need exists for a ternary CAM memory which can operate in a single clock cycle. With no speed disadvantage over binary CAMs, ternary CAMs could be used for such things as address resolution, filtering, mapping, virtual LANs, Asynchronous Transfer Mode (ATM) communications and systems, etc.

DETAILED DESCRIPTION OF A PREFERRED EMBODIMENT

In accordance with the present invention, a ternary CAM architecture is provided, comprising a binary-to-ternary conversion subsystem for providing first and second ternary data outputs responsive to binary data input, a memory for simultaneously storing the first and second ternary outputs and providing a content addressable memory, and a comparator for providing a match output responsive to the comparison of binary data currently being input for comparison as compared to the stored first and second ternary data outputs in the memory. In the preferred embodiment, there are a plurality of memory cells, forming a plurality of multiple bit storage words for storing the first and second ternary data outputs for a plurality of words. Furthermore, in the preferred embodiment, a mask register subsystem is provided that is utilized in performing the binary-to-ternary data conversion of data input signals, both for purposes of storing the ternary data outputs in the memory and for purposes of providing ternary data input for comparison to the stored ternary data. In the preferred embodiment, a plurality of addressable mask registers provide for the selection of any one of a plurality of binary-to-ternary conversion options, both for purposes of storage, and independently for purposes of input data conversion for purposes of comparison.

In accordance with one aspect of the present invention, a method of storing ternary data is provided, comprising the steps of (1) initializing a conversion register by storing binary-to-ternary mask data in a conversion register; (2) storing ternary data in a content addressable memory (CAM) by inputting a single bit binary data to the conversion register; and converting the binary data into two bits of ternary data using the conversion register; and (3) simultaneously storing the two bits of ternary data in first and second memory cells.

In one embodiment, for subsequent searching, the method is further comprised of the steps of searching for a match of input search binary data to the stored contents of the CAM; providing a match valid output responsive to the input search binary bits matching any of the stored contents; and generating an address corresponding to a location in the CAM where the match is found. The step of searching for a match is further comprised of the steps of converting the input search binary data into ternary search data, using the conversion register; and comparing the contents of the CAM to the ternary search data.

Figure 1:
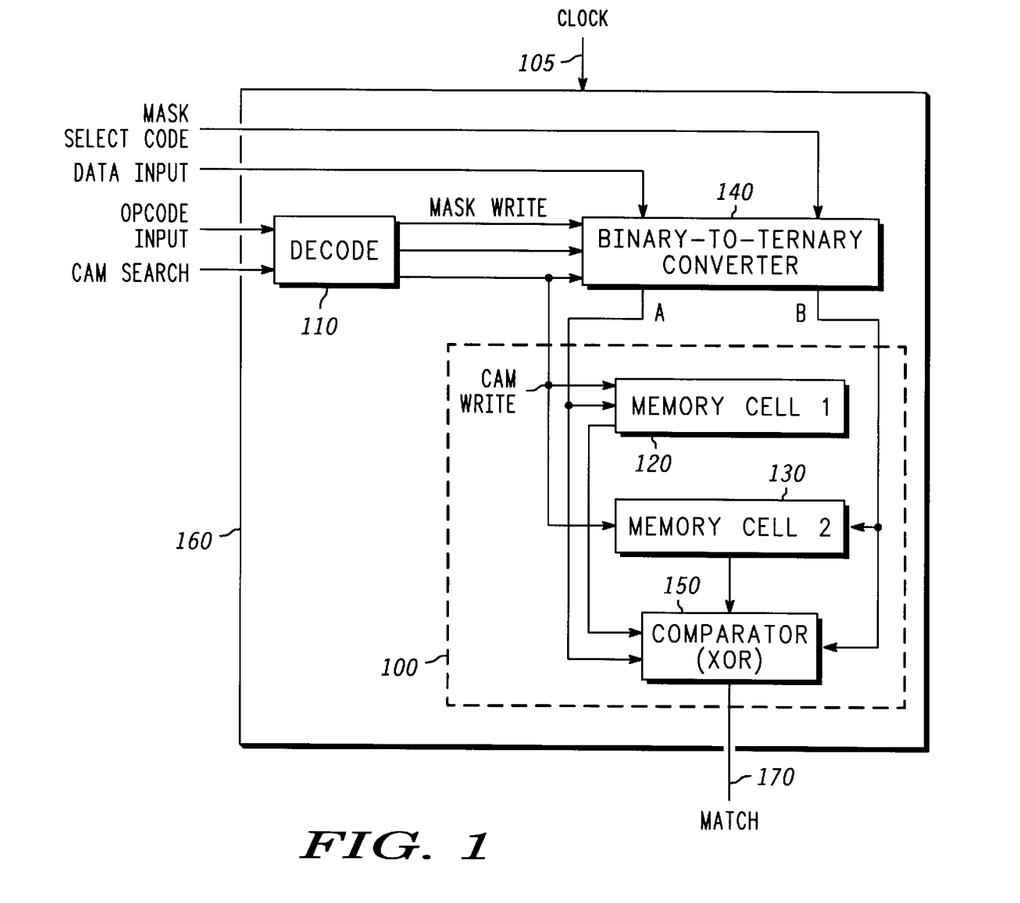
FIG. 1 illustrates a memory cell in accordance with the present invention for a ternary CAM cell semiconductor.

Referring to FIG. 1, there is illustrated a memory cell for a ternary CAM cell 100 in CAM memory subsystem 160, in accordance with the present invention. An externally provided Opcode input is decoded by decoder 110 to provide control signals for Mask Write, CAM Write, and other control signals to other areas of the chip, as will be described in greater detail hereafter. The CAM cell 100 is comprised of a first memory cell 120 and a second memory cell 130, which are utilized to store the ternary data for that CAM cell location. Memory cell 120 stores the 1 or 0 data values, while memory cell 130 stores a 1 for a don't care "x" value selection, and a 0 to indicate that the memory cell contains data that should be utilized. An external clock is provided to the subsystem 160, where the clock signal 105 is utilized to synchronize operations within the CAM memory. Additionally, external Mask Select code signals and Data Input signals are provided to the CAM memory 160 and are coupled to a binary-to-ternary converter 140 that converts the binary Data Input into appropriate ternary data signal outputs A and B, which respectively couple to memory cells 120,130. The Mask Write, CAM Write, and CAM Search outputs from the decode logic 110 are coupled to the binary-to-ternary converter 140. These outputs from the decode logic 110 selectively control (1) the writing of the Data Input into the mask registers and into the binary-to-ternary converter, responsive to the Mask Select code; (2) the conversion of the Data Input by the binary-to-ternary converter into ternary code; (3) the writing of the ternary code into the memory cells 120 and 130 responsive to the CAM Write decode output; and (4) the activation of a CAM search for comparing the ternary code for the then present current Data Input to the CAM cell contents by a comparator 150, which is clocked at the appropriate time to do the comparison.

The Mask Select code, Data Input, Clock, and Opcode inputs are provided to the CAM memory 160 from an external device or subsystem, such as a processor, which controls and establishes the loading of the mask registers in the binary-to-ternary converter 140, the loading of the CAM data contents into the memory cells 120,130 and the setup and request for comparison. The comparator 150 provides a Match output indicating that the Data Input either matches or doesn't match the contents of the CAM memory. The binary-to-ternary conversion subsystem 140 provides the first and second ternary data outputs (A and B) responsive to the Mask Select signals, the Data Input signals, and the Opcode signals. The memory cell 120 stores and selectively outputs the first ternary data output A, responsive to the binary-to-ternary conversion subsystem 140 and to the Opcode signals. The memory cell 130 stores the second ternary data output B, responsive to the binary-to-ternary conversion subsystem 140 and the Opcode signals. The comparator 150 performs an exclusive-OR comparison in the preferred embodiment, and provides a match output responsive to comparing the first and second ternary outputs provided by the binary-to-ternary converter 140 for the then current Data Inputs, to the outputs of the first and second memory cells. Since the data storage to memory cells 120,130 is performed in parallel, that is, the binary-to-ternary converter provides output A to memory cell 120, and output B to memory cell 130, the memory (CAM memory subsystem) device 160 is able to store the first and second ternary outputs (A and B) in the CAM cell 100, in parallel, within a single period of the clock's signal. This advantageously provides for single cycle ternary data conversion, comparison, and write cycles. The ternary CAM storage and retrieval system ("TCAM") is inherently superior to binary CAMs in masking operations, and useful in storage and/or conversion, and/or comparison. The TCAM system is useful in a multitude of applications, such as filtering, address resolution, mapping, Virtual LANS, etc.

Figure 2:
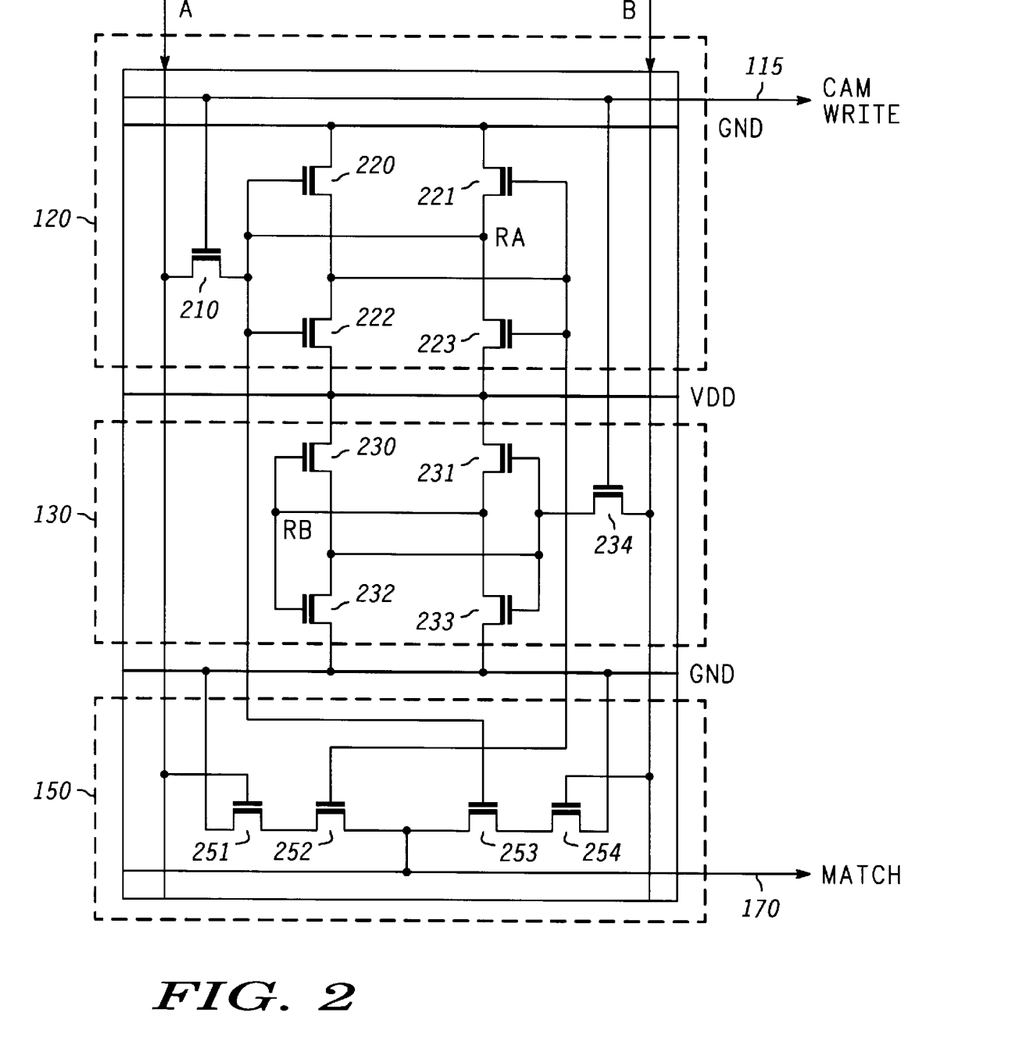
FIG. 2 illustrates a fourteen transistor static ternary CAM cell, corresponding to the memory cell 100 of FIG. 1, illustrated in further detail.

Referring to FIG. 2, a fourteen transistor static ternary CAM cell, corresponding to the CAM cell 100 of FIG. 1, is illustrated in further detail in accordance with one embodiment of the present invention. The first and second ternary data outputs (A and B) from the binary-to-ternary converter 140, are coupled to the CAM cell 100. The memory cell 120 receives the A input and, responsive to the CAM Write signal, is output from the decode logic 110, enables transistor 210 to couple the A signal to the storage element portion of the memory cell 120, as appropriately timed and clocked responsive to the external Clock, as discussed in further detail with reference to FIG. 3 for the timing diagrams for the write cycle. Transistors 220–223 form the static memory cell storage element 120. The output RA from the memory cell 120, representing an inversion of the originally input signal A, is coupled to one input of the comparator 150, as is described in greater detail hereinafter.

Similarly, the second ternary data output B is coupled to the memory cell 130 of the CAM cell 100 and is coupled via transistor 230, responsive to the CAM Write signal output from the decode logic, via transistor 230, to the memory storage cell 130 comprised of transistors 230–233, forming the storage element portion of the memory cell 130. The storage cell output from memory cell 130, output RB, provides an output corresponding to the inverted value of B as stored initially to the memory cell 130. The output RB is coupled to a separate input of the comparator 150.

In a preferred embodiment, the comparator 150 is comprised of a four transistor exclusive-OR comparator. The comparator 150 is comprised of two subportions, subportion one comprised of transistors 251 and 252, and a second subportion comprised of transistors 253 and 254. On a CAM search cycle, the then current search Data Input is converted by the binary-to-ternary converter to provide the first and second ternary data outputs A and B, which are coupled to the comparator 150 transistor gates for transistors 251 and 254, respectively. Correspondingly, the CAM memory cell outputs RA and RB are coupled to the gates of transistors 252 and 253, respectively. Thus, the ternary data for a search is coupled to the gates of one transistor of each portion of the comparator and the corresponding stored ternary data output from the CAM cell 100 is coupled to the gates of the other transistor of the corresponding portions of the comparator. Each portion forms a transistor series tree, having one side coupled to ground (e.g., the source of transistors 251 and 254) and having the other side of the tree coupled to a Match line output 170. The transistors on each side of the series tree are series connected, that is the other side (the drain) of transistor 251 is coupled to the source of transistor 252, and the drain of transistor 252 is coupled to the Match line 170 and to the drain of transistor 253, which has its source coupled to the drain of transistor 254, which has its source coupled to ground. The Match line is pre-charged during the first portion of each clock cycle to a high level, and thereafter is pulled to ground, or low level, if no match is found, thus indicating no match. If there is a match, none of the transistors in the comparator 150 are enabled and the match line stays at a high level.

It is important to note that the ternary converter outputs, A and B signals, are not bit and bit bar, but are rather the encoded two-bit state to be written into the two memory element CAM cells 120,130. Thus, the standard six transistor static RAM cell, which writes bit and bit bar into both sides of the memory element, is not utilized, but rather a five transistor memory cell is utilized that provides a single ended input structure, which is driven by the A line for memory cell 120 or the B line for memory cell 130.

The comparison circuit 150, as illustrated, is comprised of four N-channel transistors. On one side (one portion) of the comparator, the gates of each of the two transistors are tied to the A line and RA lines (transistors 251 and 252). On the other side (the other portion) of the comparator, the gates are tied to the B line and the RB line (transistors 254 and 253, respectively). On one side of the comparator, a comparison is made, between the incoming decoded A signal and the memory cell output RA signal (by transistors 251 and 252) and on the other side of the comparator, a comparison is made between the B signal and the RB signal (transistors 254 and 253, respectively). The binary-to-ternary converter 140 performs a code conversion as provided in Table 1 for a writing table (where the Write line equals one), and as provided in Table 2 for a matching table, where the Write line equals 0. For either a write or search operation, the binary Data Input is encoded by the binary-to-ternary converter 140 to corresponding A and B outputs. The Tables 1 and 2 show four ternary codes for conversion. In a preferred embodiment, the null state "N" is not used for writing or searching, and is used for pre-charge and test functions only.

Table 1 illustrates the writing table where the write line equals one, providing the logic for the binary to the ternary converter 140 performing code conversion;

TABLE 1

(B -> T Conversion Table)

| Ternary | A | B | RA | RB |
|---|---|---|---|---|
| "N" | 0 | 0 | 1 | 1 |
| "1" | 0 | 1 | 1 | 0 |
| "0" | 1 | 0 | 0 | 1 |
| "X" | 1 | 1 | 0 | 0 |

As shown, Table 1 depicts the ternary symbol (N,1,0,X) and the corresponding ternary data outputs A and B, and the corresponding memory cell outputs RA and RB.

Table 2 provides the code conversion for the matching operation for the binary-to-ternary converter 140 performing code conversion;

TABLE 2

Matching Table (Write = 0)

| Ternary | A | B | RA | RB | MA |
|---|---|---|---|---|---|
| "X" | 0 | 0 | X | X | 1 |
| "1" | 0 | 1 | X | 0 | 1 |
|  |  |  |  | 1 | 0 |
| "0" | 1 | 0 | 0 | X | 1 |
|  |  |  | 1 |  | 0 |
| "N" | 1 | 1 | 0 | 0 | 1 |
|  |  |  | ELSE |  | 0 |

As shown, Table 2 illustrates the matching table, showing the ternary symbol (N,0,1,X) and the corresponding ternary data outputs A and B, plus showing the Match output 170 resulting from a comparison of the ternary code for the input data to the stored memory cell output data (RA and RB).

By way of example, and referring to Table 2, in conjunction with reference to the comparator 150 of FIG. 2, the search data A is compared to the stored cell output RA, and if they are exclusive of each other, that is, if only one of them is logic high, this will inhibit that side of the comparator (transistors 251 and 252) from pulling the match line low. Similarly, if RB and B (the search data B) are compared, and only one of them is high, indicating that there is a match, then that side of the transistor series tree will not be able to pull the match line low. When neither one of the sides of the transistor series trees 251 and 252, or 254 and 253, are able to pull the match line low, this indicates that there is a match in the cell. Conversely, if there is not a match in the cell, for example, if both A and RA are high, this would turn on both transistors 251 and 252, which would connect the output point coupling 252 and 253 to ground, thus pulling the match line low, thus indicating there is not a match. Where there are a number of memory cells corresponding to a single memory word, the match line for each memory cell is coupled to other match lines for that single word in a wired-OR structure, such that a number of memory elements can be cascaded together to form a word, and if any of the memory cells forming the multiple bit word don't match, it will pull the match line low, indicating no match.

Figure 3:
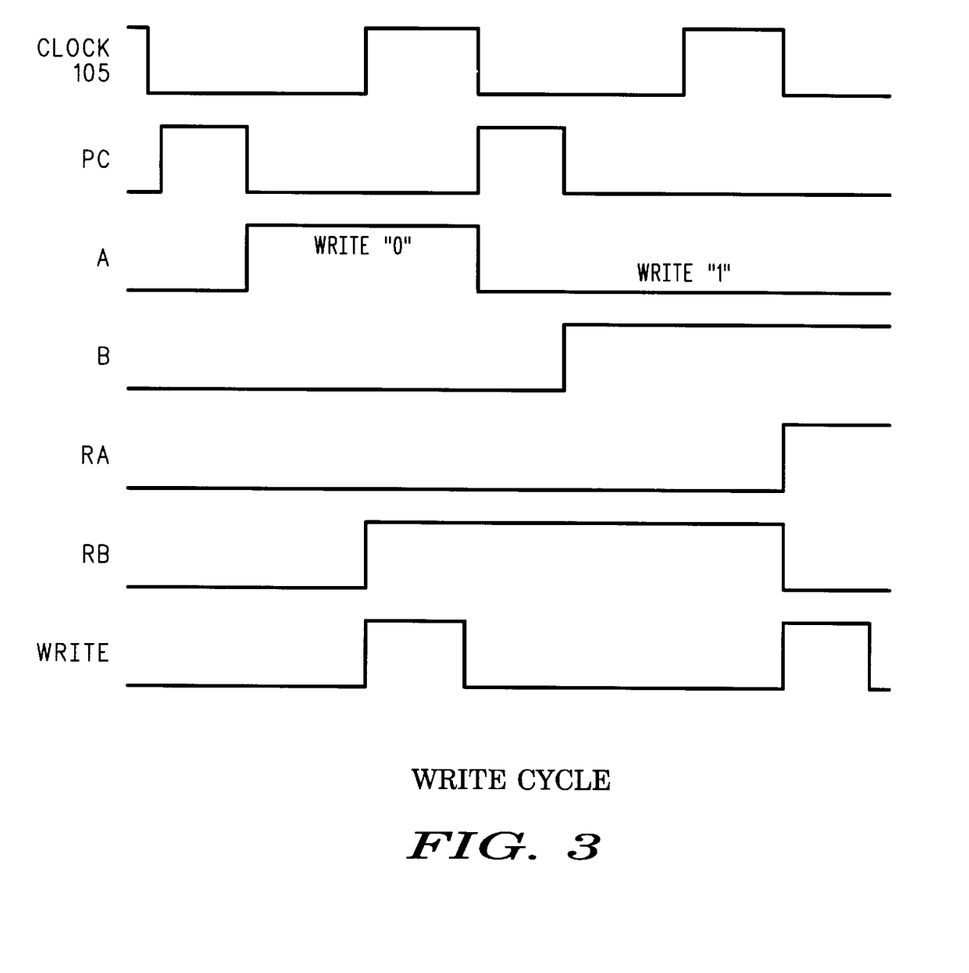
FIG. 3 illustrates the timing waveforms for the write cycles to the CAM memory, in accordance with the coding provided as illustrated by Table 1.

Referring to FIG. 3, the timing waveforms for write cycles to the CAM memory is illustrated for a write zero cycle and a write one cycle. First, it is noted that the coding of the A and B lines, as indicated in Tables 1 and 2, are such that only one of the A or B lines will transition at a time during write and search operation.

Figure 4:
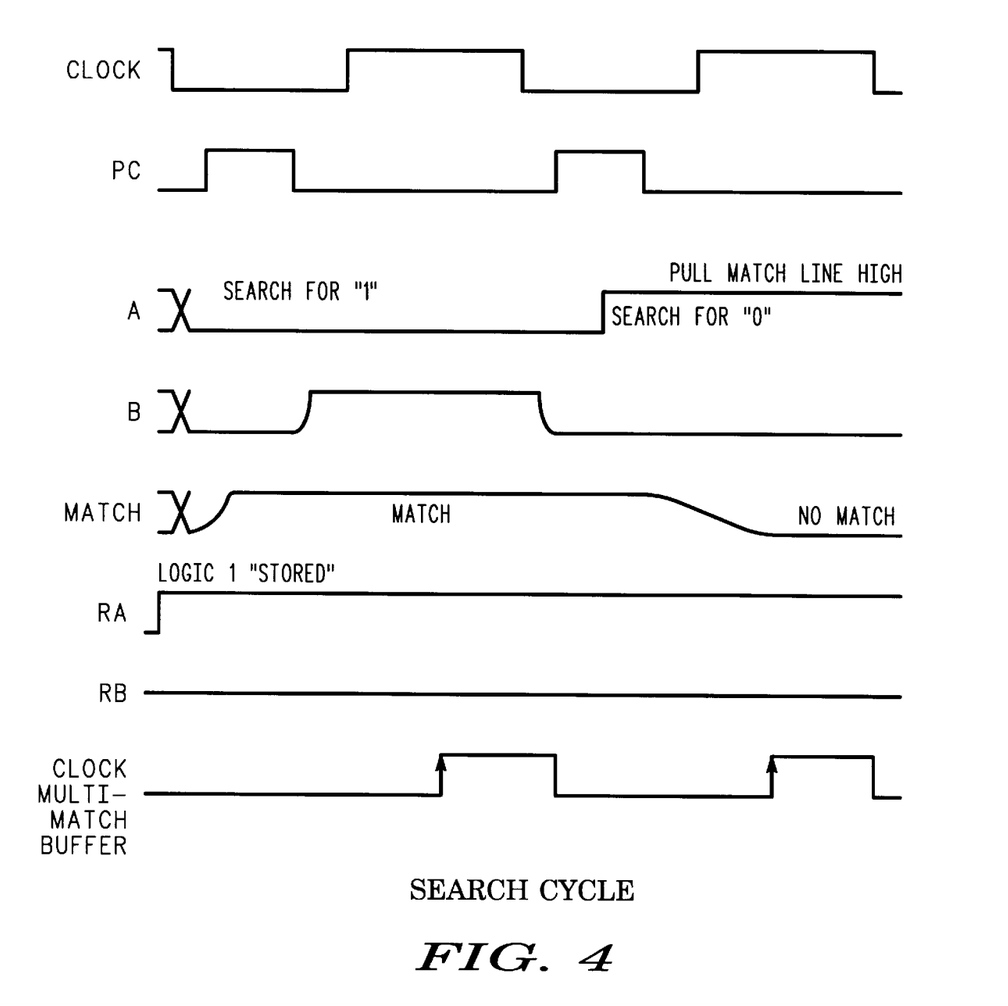
FIG. 4 illustrates the operation of the memory system during a search cycle, corresponding to FIGS. 1 and 2 and Table 2.

As illustrated in FIG. 3, there is a Clock (i.e., the Clock signal 105 of FIG. 1) which periodically cycles at a system clock rate. During the first portion of the clock cycle, a pre-charge (or setup) cycle occurs (i.e., a pre-charge signal goes high) to pre-charge the match line, and both the A and B lines are forced to an active low state, putting 0 on the A and B lines during pre-charge. This guarantees that independent of whatever data is stored in the memory cells 120 and 130, that the match line can be pre-charged to a logic one without having any DC path in the exclusive-OR circuitry of the comparator 150. After the pre-charge cycle is over (i.e., the pre-charge signal goes low), the A and B lines are allowed to change. The match line must be pre-charged, since if the match line is pulled low, it will remain low, since there is no active device to pull it up. Thus, the match line has to be reestablished at a high level each cycle, to establish a base level of one for a match each time. After the pre-charge signal goes low, a search operation can begin. This will be discussed in further detail with reference to FIG. 4. The pre-charge is not directly used in the write cycle, and is used directly for the search cycle, as illustrated in FIG. 4. However, the pre-charge period is relevant in that the A and B lines are forced low during the pre-charge cycle time.

As illustrated in FIG. 3, after the pre-charge cycle (the pre-charge clock signal goes from 1 to 0), a write operation may be performed. As illustrated in FIG. 3, a write "0" cycle occurs after the first pre-charge cycle during the first Clock cycle. The A and B signals are set up by the binary-to-ternary converter 140 and coupled to the memory cells 120 and 130 as illustrated in FIG. 1. Thus, as set forth in Table 1, to write a 0, the ternary code outputs A=1 and B=0, are provided, as illustrated in FIG. 3. The RA and RB signal lines are initially at a 0 level, and upon the Write CAM signal (115 of FIG. 2) being clocked high, the 0 write data is clocked into the memory cells 120 and 130 and correspondingly, output RA=0 and output RB =1, as illustrated in FIGS. 2 and 3, and Table 1. Referring to the Clock signal of FIG. 3, the Clock then transitions from 1 to 0, again initiating the pre-charge pulse to initiate the pre-charge cycle, forcing the A and B lines to a 0 level, and thereafter, when the pre-charge pulse goes back to a 0 level, the A and B ternary code outputs are set up for writing a 1. As shown in FIG. 3, consistent with the writing table of Table 1, the ternary code for a "1" is A=0 and B=1. Upon the Write clock 115 of FIG. 2 clocking active high, the ternary code is written into the memory cells 120 and 130, respectively, storing inputs A and B, and the memory cell outputs provide for an output of RA=1 and RB=0, consistent with Table 1, illustrating the operation of the CAM cell 100 of FIG. 2. The writing of a "don't care" would be similar to that illustrated for the writing of a 0 and 1, except that in this case, both the A and B signals would be at a high level (i.e., A=B=1), which would be clocked upon the Write clock signal going high into the memory cells 120 and 130, correspondingly thereafter providing outputs RA=RB=0. Similarly, writing an "N" into the memory cell would write a 0/0 (A=B=0), providing a corresponding 1/1 output from RA/RB (i.e., RA=RB=1), leaving it to the incoming A and B to determine if there's a match, since transistors 252 and 253 of comparator 150 would already be enabled (by RA=RB=1) for a comparison.

Referring to FIG. 4, a search cycle is illustrated in accordance with a preferred embodiment of the present invention. This assumes that the memory cells 120 and 130 have already been written to during a previous write operation. FIG. 4 illustrates only the search operation. The external input of Data Inputs and Mask Select inputs, in conjunction with the Opcode input, cause the binary-to-ternary converter 140 to provide ternary code data A and B outputs, which are ultimately fed to the comparator 150, appropriately timed as illustrated in FIG. 4. Analogous to FIG. 3, FIG. 4 illustrates the periodic Clock signal, Pre-charge clock signal, the ternary code outputs A and B, and the memory cell outputs RA and RB, and also illustrates the Match line output 170, corresponding to FIGS. 1 and 2 and Table 2. The timing diagram of FIG. 4 illustrates first a search for a 1 and then a search for a 0. During the first portion of the Clock cycle, illustrated as the first quarter of the Clock cycle, the A and B lines are forced low, and the pre-charge line is charged to a high level (which high level indicates a Match if it still exists after a search is done). At the end of the pre-charge clock, the A and B signal lines are set up with the appropriate data, and since this is a search for 1, A=0 and B=1, in accordance with Table 2. This is compared to the stored memory cell outputs RA and RB by the comparator 150 as illustrated and described with reference to FIG. 2, and at the end of the first clock cycle, the Match line status is clocked into a buffer, and the buffer output is then decoded to determine the address where the match occurred (where there are multiple memory words in the CAM).

When the Clock goes low to start the next Clock cycle, the pre-charge signal goes high, forcing the A and B ternary code outputs low, to permit the Match line to pre-charge back to 1 if needed. Then, when the pre-charge clock signal goes low, a search for 0 is set up, with A=1 and B=0, as set forth in Table 2. Since the stored memory cell output RA=1 and RB=0, then both A=1 and RA=1, thus causing transistors 251 and 252 of FIG. 2 to couple the Match line to ground, thus forcing the Match signal low as illustrated in FIG. 4, indicating no match has occurred. As illustrated in FIG. 4, a buffer clock signal occurs at the end of each of the Clock cycles, clocking the match status into a Match Buffer. The Buffer stores the match state for each Match line word location in the CAM memory.

Also, note that if RA and RB are low, regardless of what A and B are on subsequent search cycles, there will always be a Match output. Additionally, if the external system Data Input is converted into a ternary code of 0/0 for A and B (i.e., A=B=0) for a search, indicating a don't care, then the comparator will provide a Match output no matter what is stored in the memory cells. This permits a global don't care search. Thus, two don't care search options are provided. Initially, the system can process the data coming in and store don't cares into the memory. Subsequent to that, the system can also mask out certain bits of information in the CAM, using a don't care ternary code input for the search data. Thus, a "don't care" search data input ignores what's stored in the CAM cell, and causes the respective don't care bit locations to always match. It is to be understood that there are multiple bits in the word (64 bits in the preferred embodiment), and thus individual bits can be masked for don't cares during search in real time, or can be pre-stored as don't cares when loading and writing the CAM memory cells, so that a match is found irrespective of the search data for that bit.

Figure 5:
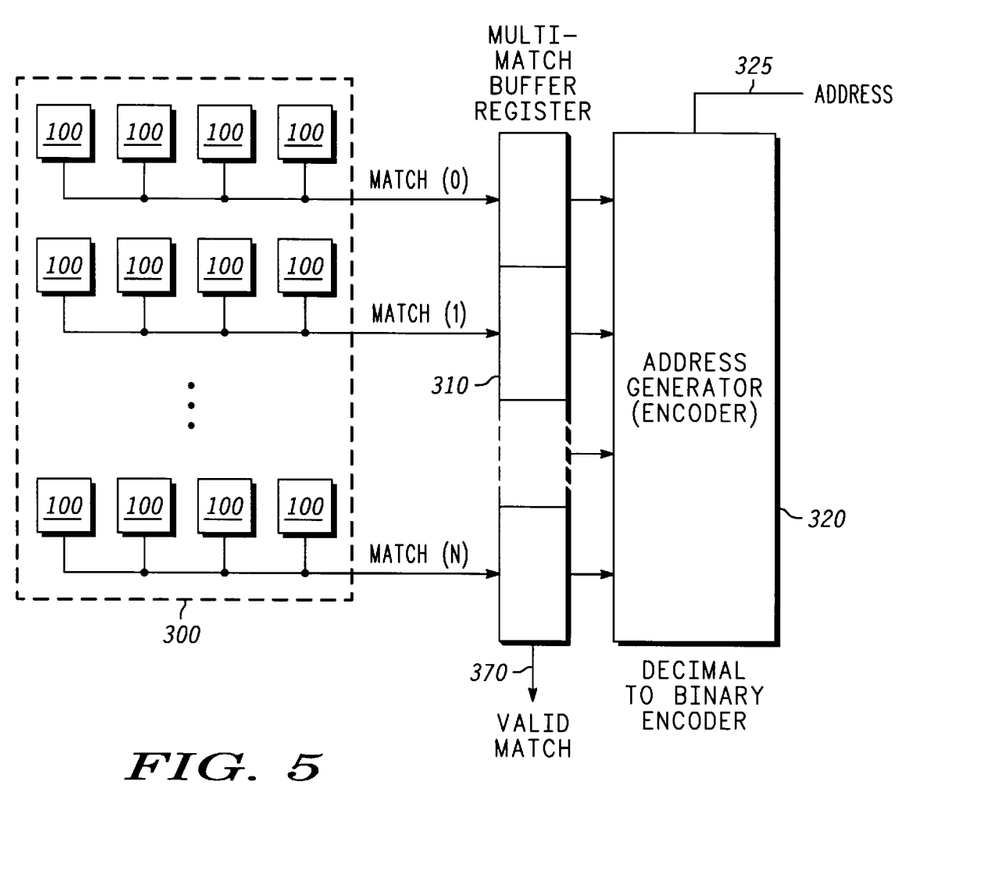
FIG. 5 illustrates a memory array in accordance with the present invention, comprised of multiple memory storage subsystems 100 of FIG. 1.

In a preferred embodiment, as illustrated in FIG. 5, the CAM memory 300 is comprised of a plurality of CAM cells 100 cascaded both in rows as words (of 64 bits each), and as multiple rows comprising multiple (64 bit) words. Each word is comprised of 64 CAM cells 100. Thus, where 64 memory subsystems are coupled together to create a 64 bit word, all 64 of these match lines are coupled together in a wired-OR structure, so that any element on the match line has the capability of pulling the match line low. Thus, all 64 bits would have to match in order for the final Match output for that word to be valid (high).

Since the comparator 150 is an exclusive-OR type device, the inverted outputs RA and RB are compared to the non-inverted ternary code outputs A and B so that inverted stored ternary code data is compared by the comparator to the non-inverted ternary code search data. The effect of the exclusive-OR is to utilize the inverted to non-inverted comparison to affect a comparison that utilizes an inverted and non-inverted input to properly perform the comparison. Other comparator structures can alternatively be utilized, which use either inverted outputs or non-inverted outputs from the memory cells 120 and 130, as inputs to the comparator, and the choice is one of design alternatives.

Referring again to FIG. 5, a memory array comprised of multiple memory storage sub-systems 100 is illustrated, wherein there are a plurality of memory subsystems 100 coupled in a row forming a word, illustrated as 4 bits wide (64 bits wide in the preferred embodiment) having a common wired-OR match output (match 0) which is coupled to a multi-Match Buffer register. There are a plurality of rows of memory subsystems 100, forming a plurality of words each n bits wide, each row coupling its match line in common to all memory subsystems 100 of that row (memory word) providing corresponding match outputs (Match (1) to . . . Match (N)), which Match outputs are coupled to separate flip-flops (or other storage) of the multi-Match Buffer register 310. The array of memory subsystems 100 form the memory array 300, in the preferred embodiment being 64 bits wide by 2048 words deep. The multi-Match Buffer register 310 provides a valid Match output 370, which indicates a valid match has occurred, and one output for each CAM location, indicating that location's match status. Thus, the depth problem is solved, and both multiple bit words and multiple word arrays of ternary CAM storage are efficiently provided without speed operational penalties.

The CAM memory system of FIG. 5 includes the memory array 300, the multi-match buffer register 310, and the address generator (encoder) 320, plus other logic as described elsewhere herein. The multi-Match Buffer register provides a plurality of outputs, corresponding to the match status for each row or word of the memory array 300, and the Buffer register 310 outputs are coupled to the address generator 320, which performs a decimal to binary encoder function to provide an address output 325, representative of the address where the first match occurred. In the preferred embodiment, the encoding is from 2048 registers to a 10 bit binary code. This then provides an address output from the CAM memory system which indicates the address corresponding to the first valid match.

Figure 6:
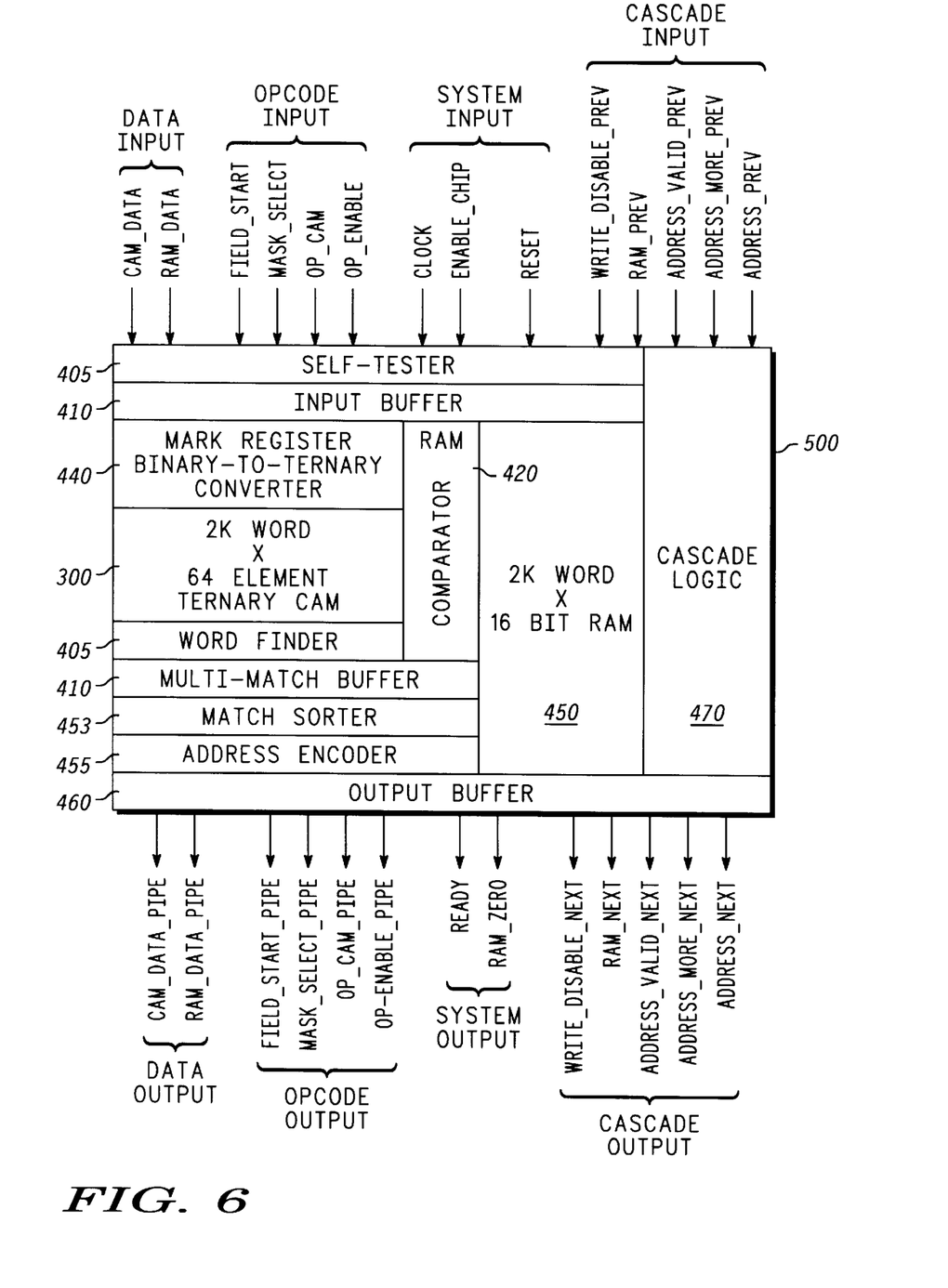
FIG. 6 illustrates a functional block diagram of a CAM memory system in accordance with the present invention, and illustrates external inputs and outputs to the memory system.

Referring to FIG. 6, a functional block diagram of a CAM memory system is illustrated, wherein external system inputs are provided as Data Input, Opcode Input, System Input, and Cascade Input, and where the memory system output is comprised of a Data Output, Opcode Output, System Output, and Cascade Output. Self testing is possible through the use of the Opcode Input and System Inputs, and can be performed by a self-test sub-system 405, and can be optionally provided depending on design considerations. The data coming in through the Data Input is coupled through the input buffer 410 to mask registers 440, which provide for binary-to-ternary conversion, in accordance with Tables 1 and 2. A host processor system provides the Opcode and Data Inputs necessary to load the mask registers to determine when don't cares are to occur. Thus, initially the host processor provides appropriate Mask Select inputs and CAM Data Inputs to load the mask registers. In a preferred embodiment, 8 mask registers are used, and a 3 bit Mask Select input can provide selection of one of the 8 mask registers. Upon completion of loading of the mask registers, the host system provides either a 1 or 0 (binary data), and a Mask Select code, and the binary-to-ternary converter converts the binary input into ternary code data as described earlier with reference to Tables 1 and 2 and FIGS. 1 and 2. The mask register is the width of the CAM words, 64 bits in the preferred embodiment, and any one of those bits, or any combination of those bits within each mask register, can be set to a logic 1 to mask out any bit location within the word being written into the CAM as a don't care. If there is a 0 in the mask register, then the data (i.e., 0 or 1) is appropriately written into memory cell 120 of FIG. 1. When selected during CAM Write, the CAM memory is written into so that memory cell 120 is written with a binary 1 or 0, and dependent on the mask register bit, a 1 or 0 is written into memory cell 130, indicating either a don't care where a 1 is written into memory cell 130 for those mask register bits having a 1, or that valid data (i.e., a 1 or 0) exists in memory cell 120 where a 0 is written into memory cell 130. In one embodiment, RAM storage is provided as a part of the CAM memory system, illustrated as RAM 450, which provides storage corresponding to each word of the CAM array. In the preferred embodiment, 2K words by 16 bits of RAM are provided corresponding to the 2k words of CAM. However, the width is determined by design constraints, in a preferred embodiment, 16 bits.

The RAM is loaded by the host system (or other external device), using the Opcode Inputs, and the RAM Data Inputs of the Data Input, to provide for loading of the RAM with contents that are thereafter provided as outputs for matched CAM locations, responsive to the multi-Match Buffer 410 and the RAM comparator 420, to provide RAM data output (for the matched Cam location) to the output buffer 460. The output buffer 460 provides the Cascade Output for a multiple memory system chip cascaded configuration including the RAM next output, the address output indicative of a match being found, and other control signals to permit cascading, as well as feed-through of the Data Output corresponding to the Data Input via CAM data pipe 0–63, and RAM data pipe 0–15. Additionally, the output buffer 460 provides feed-through of the Opcode input including Field Start pipe, Mask Select pipe, OpCAM pipe 0–3, and OpEnable pipe 0–2. The System Output feeds through the Clock, and the Ready, and RAM Zero System Output. The outputs provide for multiple ones of the memory chip systems 500 for coupling to one another to form an array (e.g., having a depth greater than 2K), but providing for output of the address and data (where the RAM is present within the system 500) to provide the indication of the address and corresponding RAM data for the first match location. The cascade logic 470 provides for cascade logic and feed-through of appropriate signals from the Cascade Input, the RAM, the multi-Match Buffer, and the address encoder to provide for the Cascade Output. The address encoder 455 is coupled through the Match Sorter 453 to the multi-Match Buffer 410, to provide a decode of the Match Buffer 410 and provide the corresponding address where the match was found. The Word Finder logic 405 provides necessary decode logic between the CAM memory array 300 and the multi-Match Buffer 410 to provide appropriate logic for interfacing to the multi-Match Buffer 410 and the RAM comparator 420.

Figure 7:
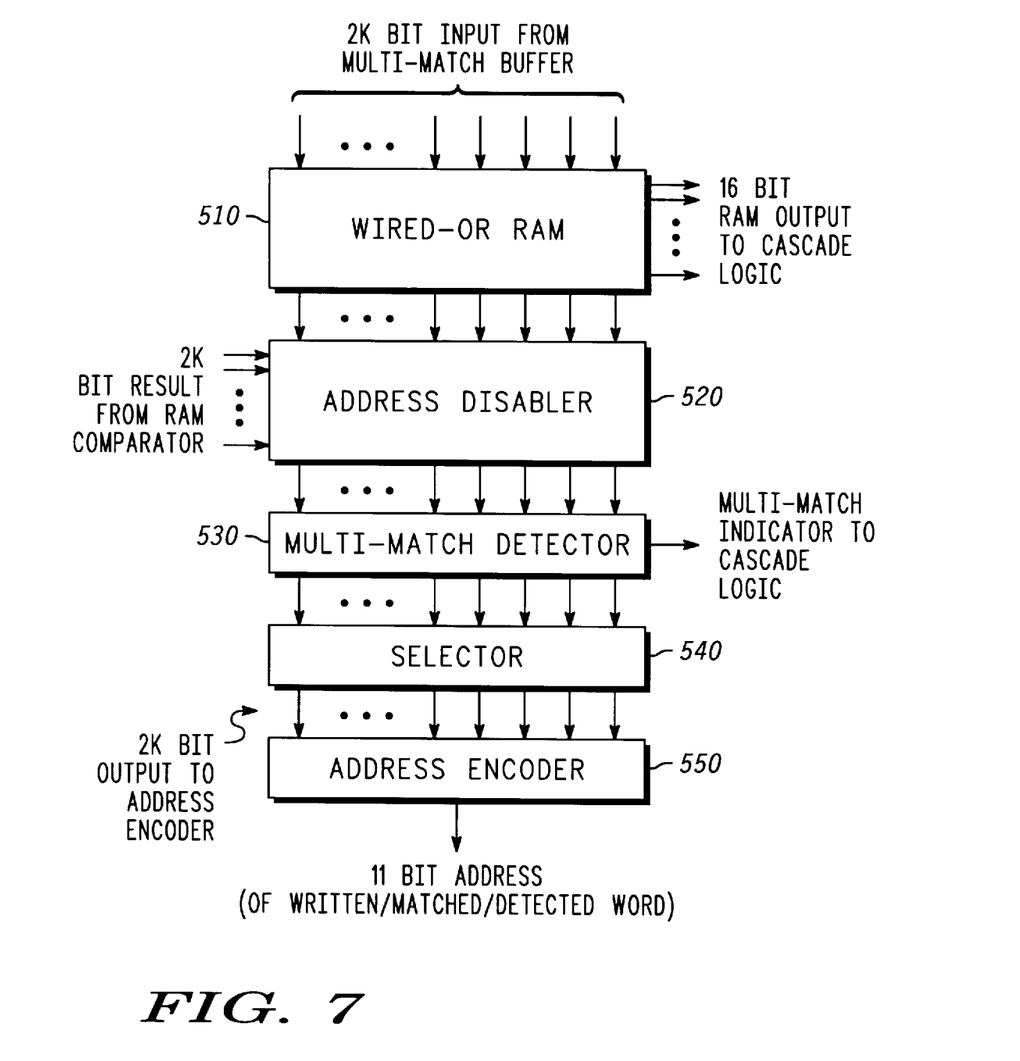
FIG. 7 illustrates a detailed diagram of the match sorter and address encoder of FIG. 6 in further detail.

Referring to FIG. 7, the main components of the match sorter and address encoder of FIG. 6 are provided in greater detail. The 2 kilobits of output from the multi-match buffer 410 are coupled as inputs to a wired-OR RAM 510, which provides a 16 bit RAM output to the cascade logic 470 as shown in FIG. 6. The wired-OR RAM 510 corresponds to the RAM array 450 and RAM comparator logic 420 of FIG. 6. The output of the wired-OR RAM is also coupled to an address disabler 520, which selectively disables the address output responsive to the output from the RAM comparator 420. The address disabler output selectively provides an address disabling output to the multi-match detector 530, which provides an indication of a multiple match indicator to the cascade logic 470, and detects if more than one of the 2K lines are active. The selector 540 picks the first matched word and disables all others (the lowest address having the highest priority in the illustrated embodiment), and provides 2 kilobits of output to the address encoder to be encoded into an 11 bit address output from the address encoder 550 (as discussed in detail with reference to FIG. 5 address generator encoder 320 and analogous to the address encoder 455 of FIG. 6) indicative of the written, matched, or deleted work, depending on the type of operation being provided.

Figure 8:
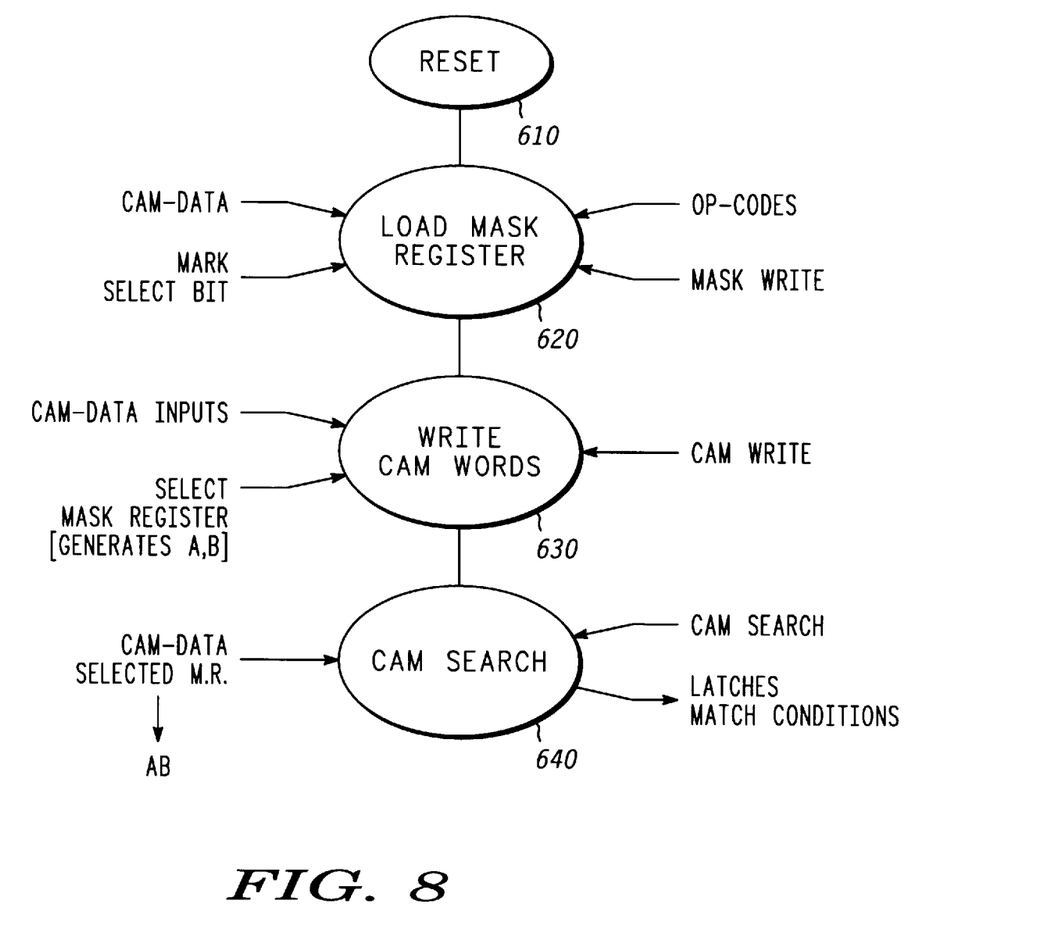
FIG. 8 illustrates a state flow chart of the operation of the CAM memory system in accordance with the present invention.

Referring to FIG. 8, a state flow diagram is provided illustrating the operation of the system in resetting, loading mask registers, writing CAM words, and performing a CAM search. Initially, at state 610, the external system provides for a chip Reset that initializes everything (e.g., all memory cells and mask registers) to 0. Thereafter, the next state 620 provides for loading of the mask registers. In the preferred embodiment as discussed above, there are 8 mask registers, however a single mask register can be used multiple times, and the choice is one of design alternatives. Responsive to the Opcode Inputs and Mask Select bits, and the Mask Write signal, the CAM Data Input is written into the mask registers at step 620, as indicated via the signal inputs coupling into step 620 from the left and right. To avoid applying any mask to the CAM Data being written in, one mask can be reserved and loaded with all 0's, which provides for no masking function. When writing to the CAM, at step 630, the Opcode combination provides appropriate signals, and the Mask Write is inactive, indicating a Mask Write is not occurring, and that the write cycle is a CAM data write. The CAM Write signal is active, and the CAM Data Inputs are coupled into and written via a selected mask register as determined by the Mask Select bits. This results in the binary-to-ternary converter generating the appropriate A/B signals that go into the CAM memory elements for storage. Once the CAM memory array has been written to and the data stored (and where a RAM is located internal to the CAM memory system the RAM is also loaded as appropriate via RAM Data Inputs and appropriate Opcode signals), a CAM Search operation can be provided. The CAM search operation is responsive to a CAM Search Opcode, and the CAM Data Input, and a selected mask register as selected via Mask Select bits, which, as shown at step 640, provides for determining whether there is a match between the then current input CAM Data as compared to any stored value in the CAM memory array. If a match is found, the corresponding match lines are latched (in the multi-Match Buffer) and the output from the chip system is an address indicating where the match occurred. Additionally, where RAM is present on the chip, the RAM data for the corresponding CAM word location where a match was found is also output from the chip.

Figure 9:
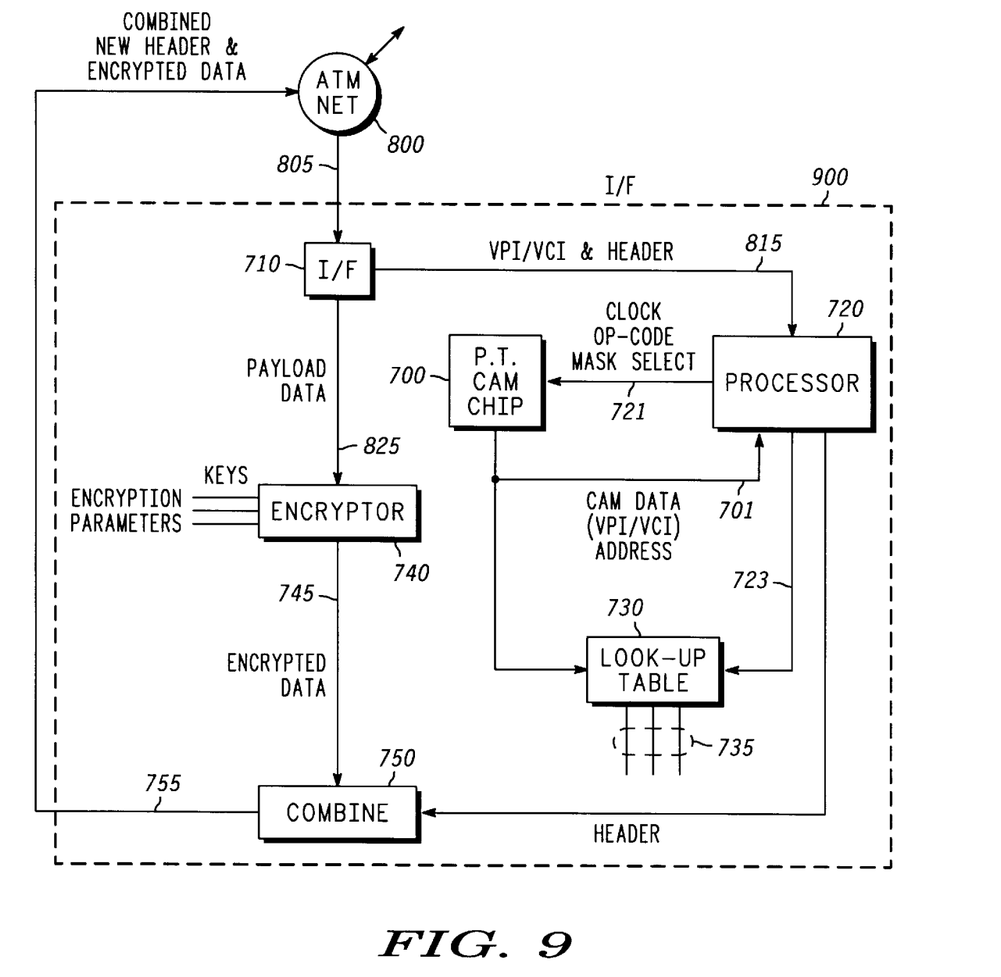
FIG. 9 illustrates a system embodiment of the CAM memory system of the present invention in an ATM data encrypting embodiment.

Referring to FIG. 9, the memory system of the present invention is illustrated in an encryption embodiment for use in conjunction with an Asynchronous Transfer Mode (ATM) system. During an initial call setup, the ATM network 800 provides for communication of information coupled via bus 805 to interface 710 to establish a call setup procedure prior to performing a write operation. The ATM memory system embodiment system 900 provides for storing of new ATM virtual address (i.e., as commonly denoted by its Virtual Pipe Identifier (VPI) and Virtual Channel Identifier (VCI)) link data to be setup and stored into the CAM memory array of memory system 700 by performing the CAM Write cycle process. In accordance with the present invention, a ternary CAM system is provided that provides for ternary information being written into the ternary CAM cells in a single Clock cycle, which allows for the writing of a continuous stream of ATM messages, instead of having to stall or delay the ATM system to facilitate a multiple cycle ternary CAM Write with risk of cell loss. In typical applications, an entire block of VPI/VCI link translation address information is setup in the CAM memory cells, the lookup table, and the internal RAM if present, all in one continuous set of operations rather than just one location. A real-time communication network is thereby provided.

After initial setup, communications from the ATM net 800 via coupling 805 is made to an interface 710, which strips off the VPI/VCI portion of the header from the payload and remaining header potion of the ATM cell, and sends the VPI/VCI and remaining header, via coupling 815, to the processor 720. The processor 720 provides the appropriate Clock, Opcode, Mask Selects, CAM data, and other appropriate input signals via coupling 721 to the ternary CAM memory system 700. The ternary CAM memory system 700 can be comprised of one or a plurality of cascaded CAM memory systems of the type discussed elsewhere herein. After setup is complete, the CAM search (and lookup table) can be utilized.

The CAM Data from the processor, which is requesting a compare, is the stripped-off VPI/VCI portion of the header, which is compared to the contents of the CAM memory 700, which in turn provides an address output 701 when a match occurs. The address output 701 is coupled back to the processor 720 and to a lookup table 730. During setup, the processor 720 loads the lookup table 730 with data, via coupling 723, corresponding to the Address output of the CAM 700. The lookup table 730 outputs specific encryption parameters 735 responsive to the address output of the CAM memory system 700. The lookup table 730 provides the encryption parameters 735, which can be a unique key or some mechanism that sets up an encryptor 740. The encryption parameters 735 are coupled to the encryptor 740, which is also coupled to receive the payload data portion of the cell 825, as provided by the interface 710. The encryptor 740 then encrypts the payload data in accordance with the specific encryption parameter keys as provided by the lookup table 730, which are uniquely associated with the specific VPI/VCI address that was input as CAM Data into the CAM system 700. The encrypted data output 745 from the encryptor is coupled to a combiner 750, which recombines the encrypted data of the payload with the header, including the VPI/VCI address, and provides a combined new cell comprising the header and encrypted data as output at 755 for coupling back to the ATM network 800 for communication therefrom to the appropriate destination.

The lookup table 730, while illustrated external to the CAM memory system 700, can alternatively be provided as a part of the CAM memory system 700. However, to provide sufficient encryption parameters, it is desirable to have more than a 16-bit wide amount of RAM. Thus, to maintain cost effectiveness of the CAM memory chips of the memory system 700, the lookup table can be provided externally and addressed responsive to the address output from the CAM memory system 700, to add flexibility to the system design. The RAM within the CAM chip itself, where present, can be used to provide sync pulses, end-of-frame indicators, and many other simpler functions than the encryption parameters, and can be provided in addition to the lookup table 730. Thus, the presence of the RAM within the CAM memory system 700 is optional, and if present, can be supplemented by an external separate lookup table. Since not every CAM address needs to have a lookup table encryption, an external lookup table can be used with a much denser lookup function than an on-chip RAM. In one embodiment, the RAM is on-chip within the CAM memory system 700, and the lookup table is integrated internally, eliminating the need for the external lookup table 730.

The lookup table is loaded as appropriate, corresponding to the CAM cell loading, via the processor 720, monitoring when a write operation is performed into the CAM memory 700, and then providing a CAM address output 701 from the CAM 700, which indicates the memory location that is actually written to. Subsequent to that, the processor 720 takes the appropriate action to load in the lookup table an appropriate mapping of the encryption parameters as necessary to support that VPI/VCI address. Even where the lookup table is in RAM internal to the CAM memory system 700, the processor still monitors and rewrites into the RAM appropriately to load the encryption parameter data needed. The processor 720 provides the Mask Select, Data Input, the Opcode Data input, the Clock, and other necessary parameters for use by the CAM memory system 700. The processor 720 processes the VPI/VCI and remainder of the header, and determines the next appropriate step. In the preferred embodiment, the VPI and VCI portion and the remainder of the header are typically not encrypted or transformed by the encryption system as illustrated in FIG. 9, and are recombined with the encrypted data by the combiner 750. Alternatively, the VPI/VCI could be re-mapped via the processor and VPI/VCI mapping contained either within the CAM system 700 as RAM or utilizing another external memory system, to provide a new VPI/VCI address to be recombined with the remaining original header and the encrypted data.

The encryptor 740 provides a method of scrambling the input data based on certain encryption parameters, which can be any sort of scrambling and encryption, such as keys for a specific user path. The encryption parameters in the lookup table are thus loaded in accordance with some predefined encryption algorithms to provide the necessary parameters for the encryptors 740. The keys are loaded as appropriate, so that each respective VPI/VCI address has associated with it its own key, or no key, so that the corresponding destination address system can decode the encrypted data on the other end with that unique key. The lookup table must provide the appropriate equivalent key, so the encryptor encodes the payload data in accordance with the key that is going to be used on the other side when the payload data is decoded.

During the initial call setup from the ATM network, messages are passed back and forth to define what keys (e.g., encryption parameters) to be stored in the lookup table) can be used, what algorithms, which VPI/VCI locations have access, and various other parameters that can be defined for the encryption process. An agreed-to initial key can be used to encrypt the initial data that is sent with a common public key that all users have, and thereafter, private keys are utilized for encryption and decoding. The private key is unique for a VPI/VCI pair, although multiple VPI/VCI pairs can have the same key. The processor 720, responsive to the loading of the CAM, provides for loading the lookup table with the corresponding keys for certain addresses in response to communications from the ATM network 800 of key values for certain VPI/VCI addresses. The interface 710, the ternary CAM memory system 700, and the processor 720 provide translation of the VPI/VCI addresses to addresses for encryption keys for the respective VPI/VCI addresses, responsive to the ternary CAM 700 output 701. The output 701 provides the address to the lookup table 730 which provides the encryption parameters 735 as necessary to encrypt the payload data 825 by the encryptor 740. The encryption payload data is combined by the combiner 750 with the header for output 755 to the ATM network 800.

The ATM system benefits by utilizing off-loaded key encryption of payloads, independent of address routing information (e.g., VPI/VCI), which is first stripped, and, after encryption, re-appended from/to the payload. This encryption of payloads can be performed transparently to the ATMs' other network operations. This benefit can also be utilized by other communications schemes, where a portion is stripped off, is encrypted, and then recombined for transmission. On the receiving side, the same associative lookup/mapping is used to determine the encryption keys, and the encrypted payload is then de-encrypted using the encryption keys.

What is claimed is:

1. A memory apparatus for coupling to an external device, the external device outputting (a) a plurality of data input signals to be processed in the memory apparatus, the plurality of data input signals comprising at least a first data input signal and a second data input signal, (b) mask select signals for specifying a data mask indicating desired locations of don't care bits for the data input signals, and (c) opcode signals for specifying operations to be performed by the memory apparatus, the memory apparatus comprising:

a binary-to-ternary conversion subsystem that generates first and second ternary data outputs for each of the plurality of data input signals based upon the mask select signals, the plurality of data input signals, and the opcode signals; and at least one memory subsystem, comprising:
a first memory cell for storing the first ternary data output for the first data input signal in response to the binary-to-ternary conversion subsystem and the opcode signals, said first memory cell having an output;
a second memory cell for storing the second ternary data output for the first data input signal in response to the binary-to-ternary conversion subsystem and the opcode signals, said second memory cell having an output; and
a comparator for comparing, in response to the opcode signals, the first and second ternary data outputs for the second data input signal to the outputs of the first and second memory cells, said comparator outputting a first match output.

2. The memory apparatus as in claim 1, further comprising:
means for supplying a periodic clock signal;
wherein the memory apparatus stores the first and second ternary data outputs for the first data signal within one period of the periodic clock signal.

3. The memory apparatus as in claim 1, wherein the binary-to-ternary conversion subsystem is further comprised of:
a mask register subsystem for selectively storing the data input signals during a setup cycle and for thereafter encoding the data input signals into the first and second ternary data outputs based on the mask select signals.

4. The memory apparatus as in claim 3, wherein the mask register subsystem is comprised of a plurality of mask registers that are addressable using the mask select signals.

5. The memory apparatus as in claim 1, wherein said at least one memory subsystem includes a plurality of memory subsystems that are arranged in rows to form a plurality of multiple bit words;
wherein the first match outputs for the memory subsystems forming each multiple bit word are connected together in a wired-OR connection, the logical-OR connections for the plurality of multiple bit words outputting a second match output.

6. The memory apparatus as in claim 5, wherein each of the plurality of multiple bit words has an associated address location, the memory apparatus further comprising:
means for outputting an address location corresponding to the second match output.

7. The memory apparatus as in claim 6, further comprising:
means for outputting a data output associated with the address location corresponding to the second match output.

8. A method of storing ternary data, comprising the steps of:
initializing a binary-to-ternary conversion register by storing binary-to-ternary mask data in the binary-to-ternary conversion register, wherein the binary-to-ternary mask data comprises information relating to the location of don't care bits for input data;
inputting a single bit of binary data to the binary-to-ternary conversion register;
converting the single bit of binary data into first and second ternary data outputs using the binary-to-ternary conversion register; and simultaneously storing as stored content addressable memory (CAM) data the first and second ternary data outputs in first and second memory cells forming a content addressable memory.

9. The method as in claim 8, further comprising the steps of:
providing input search binary data;
searching for a match of input search binary data to the stored CAM data; and
generating a match valid output when the input search binary data matches any of the stored CAM data.

10. The method as in claim 9, further comprising the step of:
generating an address corresponding to a location in the CAM where the match is found.

11. The method as in claim 9, wherein the step of searching for a match is further comprised of the steps of:
converting the input search binary data into ternary search data, using the binary-to-ternary conversion register; and
comparing the stored CAM data to the ternary search data.

12. A memory system comprising:
a binary-to-ternary conversion register; and
means for initializing the binary-to-ternary conversion register, comprised of:
means for storing binary-to-ternary mask data in the binary-to-ternary conversion register, said binary-to-ternary mask data comprising information relating to the location of don't care bits for input data;
a content addressable memory (CAM) comprising at least first and second memory cells for storing ternary data;
means for storing the ternary data in the CAM, comprising:
means for inputting a single bit of binary data to the conversion register;
means for converting the binary data into two bits of ternary data using the conversion register; and
means for simultaneously storing as stored CAM data the two bits of ternary data in the first and second memory cells of the CAM.

13. The memory system as in claim 12, further comprising:
means for supplying input search binary data;
means for searching for a match of input search binary data to the stored CAM data; and
means for generating a valid match output when the input search binary data matches any of the stored CAM data.

14. The system as in claim 13, further comprising:
address generator means for generating an address corresponding to a location in the CAM where the match is found.

15. The system as in claim 13, wherein the means for searching for a match is further comprised of:
means for converting the input search binary input into ternary search data, using the conversion register; and
means for comparing the contents of the CAM to the ternary search data.

16. A memory system for providing secure asynchronous transfer mode (ATM) communications for an ATM network that transmits a plurality of data cells, each of the plurality of data cells comprising payload data and header data comprised of virtual path identifier (VPI) address data and virtual channel identifier (VCI) address data, the memory system receiving a plurality of data input signals, encryption VPI and VCI addresses, and associate key data signals, the memory system comprising:
a ternary content addressable memory (TCAM) subsystem for storing a first one of the data input signals as stored ternary data, and for determining a match output address by comparing another one of the data input signals to the stored ternary data;
an addressable lookup table subsystem for storing the key data signals and selectively outputting the key data signals in accordance with the match output address;
wherein the TCAM subsystem and the addressable lookup table subsystem form a memory subsystem;
means for initializing the memory subsystem comprising:
means for storing the encryption VPI and VCI addresses in the TCAM subsystem;
means for storing the key data associated with the encryption VPI and VCI addresses in the lookup table;
means for separating the payload data from the header data for each of the data cells;
means for delivering the separated header data to the TCAM, wherein the TCAM selectively outputs the match output address when the separated header data matches one of the stored VPI and VCI addresses;
wherein the lookup table outputs the key data associated with the respective match output address;
means for encrypting the payload data in accordance with the key data; and
means for combining the encrypted payload data with the separated header data to form an encrypted data cell.

17. The memory system as in claim 16, further comprising means for transmitting the encrypted data cell to the ATM network.

18. A memory system for implementing a secure asynchronous transfer mode (ATM) communication system that transmits a plurality of signals comprising associated encryption key data, virtual path identifier (VPI) data, virtual channel identifier (VCI) data, and data cells, each data cell comprising payload data and header data, said header data comprised of VPI/VCI data, wherein respective ones of the encryption key data are associated with respective ones of the VPI/VCI data, the memory subsystem comprising:
a content addressable memory (CAM) subsystem for storing data therein;
an addressable lookup table;
a processor for storing VPI/VCI data into the CAM subsystem, each at a respective storage address, and for storing the respective associated encryption key data into the lookup table at a location mapped to the respective storage address;
a decoder for separating the header data from the payload data for each of the data cells;
wherein the CAM subsystem includes means for comparing the stored data therein to the separated header data to selectively determine a match address output when the separated header matches any of the stored data therein;
wherein the lookup table outputs the associated encryption key data based on the match address output;
an encryptor for encrypting the separated payload data based on the encryption key data output from the lookup table; and a combiner for combining the encrypted payload data with the separated header to form an encrypted data cell.

19. The memory system as in claim 18, further comprising:

means for communicating the encrypted data cell through standard ATM infrastructure systems.

20. The memory system as in claim 19, further comprising:

means for receiving the communicated encrypted data cell;

a decoder for separating the header data from the payload data for each of the communicated data cells;

wherein the separated communicated header data is compared to the stored data in the CAM subsystem;

wherein the CAM subsystem compares the stored data therein to the communicated separated header data to selectively determine the match output when the communicated separated header matches any of the stored data therein;

a decrypter for de-encrypting the communicated encrypted separated payload data based on the encryption key data; and means for communicating the de-encrypted separated payload data.

21. A memory apparatus, comprising:

a plurality of memory locations each capable of storing at least one data record having multiple bit positions;

means for receiving data records from an exterior environment for storage in said plurality of memory locations;

means for storing said received data records in said plurality of memory storage locations;

means for receiving a search data record from an exterior environment for comparison with data records stored in said plurality of memory locations;

means for comparing said search data record to multiple data records stored in said plurality of memory locations, to determine whether a record match exists between said search data record and one of the multiple data records, said comparing means comparing each bit position of said search data record to a corresponding bit position in each of said multiple data records;

means for storing first don't care bits in selected bit positions within said multiple data records stored in said plurality of memory locations, said first don't care bits each resulting in a bit match when compared with data bits in said search data record irrespective of the content of said search data record; and means for adding second don't care bits to selected bit positions in said search data record, said second don't care bits each resulting in a bit match when compared to data bits in said multiple data records irrespective of the content of said multiple data records.

* * * * *

UNITED STATES PATENT AND TRADEMARK OFFICE
CERTIFICATE OF CORRECTION

PATENT NO. : 5,841,874
DATED : November 24, 1998
INVENTOR(S) : Robert Alan Kempke and Anthony J. McAuley It is certified that error appears in the above-identified patent and that said Letters Patent is hereby corrected as shown below:

Column 15, line 58, claim 15, insert in front of means
--address generator--.

Signed and Sealed this

Twenty-third Day of May, 2000

Attest:

Q. TODD DICKINSON

*Attesting Officer*   *Director of Patents and Trademarks*